(12) United States Patent
Nagpal (10) Patent No.: US 9,086,436 B2
(45) Date of Patent: Jul. 21, 2015

(54) METHOD OF HIGH VOLTAGE DETECTION AND ACCURATE PHASE ANGLE MEASUREMENT IN CORDLESS PHASING METERS

(75) Inventor: Anil Nagpal, Andhra Pradesh (IN)

(73) Assignee: Honeywell International Inc., Morristown, NJ (US)

( * ) Notice: Subject to any disclaimer, the term of this patent is extended or adjusted under 35 U.S.C. 154(b) by 499 days.

(21) Appl. No.: 13/329,551

(22) Filed: Dec. 19, 2011

(65) Prior Publication Data

US 2013/0154674 A1 Jun. 20, 2013

(51) Int. Cl.
| | |
|---|---|
| *G01R 27/08* | (2006.01) |
| *G01R 15/06* | (2006.01) |
| *G01R 1/00* | (2006.01) |
| *G09G 1/00* | (2006.01) |
| *G01R 17/00* | (2006.01) |

(52) U.S. Cl.
CPC ........ *G01R 15/06* (2013.01); *G01R 1/00* (2013.01); *G09G 1/00* (2013.01); *G01R 17/00* (2013.01)

(58) Field of Classification Search
CPC .............. G01R 1/00; G01R 17/00; G09G 1/00
USPC .......... 324/99 D, 72.5, 103 P, 115, 457, 458, 324/72, 76.55, 86, 107, 126–127, 142; 340/870.01–870.06
See application file for complete search history.

(56) References Cited

U.S. PATENT DOCUMENTS

| | | | | |
|---|---|---|---|---|
| 3,265,969 | A * | 8/1966 | Catu | 324/72.5 |
| 3,566,265 | A * | 2/1971 | Reid | 324/99 D |
| 4,316,254 | A * | 2/1982 | Levin | 702/72 |
| 4,418,314 | A * | 11/1983 | Nieto, Jr. | 324/72.5 |
| 5,703,928 | A * | 12/1997 | Galloway et al. | 379/21 |
| 6,617,840 | B2 | 9/2003 | Bierer | |
| 6,731,103 | B1 * | 5/2004 | Guerrero Mercado | 324/103 P |
| 6,734,658 | B1 * | 5/2004 | Bierer | 324/115 |
| 6,998,832 | B1 | 2/2006 | McNulty | |
| 7,138,810 | B2 * | 11/2006 | Lesher et al. | 324/750.26 |
| 7,282,904 | B2 * | 10/2007 | Suquet | 324/117 R |
| 7,336,063 | B1 | 2/2008 | Bierer | |
| 7,746,051 | B1 * | 6/2010 | Buchanan et al. | 324/72.5 |
| 8,536,879 | B2 * | 9/2013 | Renno et al. | 324/654 |
| 2002/0135353 | A1 | 9/2002 | Bierer | |
| 2008/0100300 | A1 * | 5/2008 | Williams | 324/458 |
| 2009/0045816 | A1 * | 2/2009 | Robinson | 324/457 |

* cited by examiner

*Primary Examiner* — Huy Q Phan
*Assistant Examiner* — Temilade S Rhodes-Vivour
(74) *Attorney, Agent, or Firm* — Wood, Phillips, Katz, Clark & Mortimer (57) ABSTRACT

A high voltage detection device comprises a probe comprising an electrode for contacting a high voltage electrical line. The electrode is connected in series with a resistor. A meter comprises a housing enclosing an electrical circuit for measuring line voltage. The electrical circuit comprises an input circuit for connection to the probe. The input circuit is adapted to suppress high frequency noise pick up by the probe and develop a bipolar voltage representing measured line voltage. A voltage detection circuit comprises a differential amplifier circuit for converting the bipolar voltage to a proportionate voltage signal. A signal processing circuit receives the proportionate voltage signal and drives the display for displaying the measured line voltage.

20 Claims, 14 Drawing Sheets

METHOD OF HIGH VOLTAGE DETECTION AND ACCURATE PHASE ANGLE MEASUREMENT IN CORDLESS PHASING METERS

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

The disclosure relates generally to high voltage phasing voltmeters and more particularly, to providing noise free detection.

BACKGROUND

Electrical power distribution systems often include overhead electrical power distribution lines mounted upon poles by a wide variety of mounting structure. Other distribution systems include underground distribution lines in which protected cables run under the ground surface. It is often necessary to take phase-to-phase voltage measurements across transmission lines while testing for induced or live power lines or equipment.

Known high voltage safety line detectors, meters and testers comprise high resistance probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized. Known devices for providing such measurements include contact type and non-contact type. With contact type a reference probe or transmitter and a meter probe or receiver are connected in series with a cable as the loop is closed with load terminals.

Phasing and phase angle measurement on utility grid lines is critical for rapid load balancing, identifying faulty circuits, and maintenance of the grid lines. Even though feeder circuits are designed to be well balanced in the initial deployment, one of the phases may turn out to be more heavily loaded than others, leading to load imbalance conditions. Phasing meters facilitate the rebalancing of the phases and provide for rapid maintenance and restoration of clean grid systems in the field.

The high voltage detection and phase angle measurements on AC high voltage electrical lines, up to 700 kV, are done in close proximity to a high 50 Hz/60 Hz field. This results in inaccurate measurements due to interference. Known meters do not incorporate procedures to eliminate this interference.

Also, phasing meters are used in outdoor locations where the meter can be affected by high frequency electromagnetic interference (EMI). The effect of this interference will be more severe during low voltage detection. Advantageously, the interference must be suppressed before entering meter printed circuit boards and provide noise free signals for processing. Known meters do not incorporate circuits to fully eliminate such interference.

The present disclosure is directed to improvements in high voltage phasing voltmeters.

SUMMARY

As disclosed herein, a high voltage detection device provides noise free detection.

There is disclosed herein a high voltage detection device comprising a probe comprising an electrode for contacting a high voltage electrical line. The electrode is connected in series with a resistor. A meter comprises a housing enclosing an electrical circuit for measuring line voltage. The electrical circuit comprises an input circuit for connection to the probe. The input circuit is adapted to suppress high frequency noise pick up by the probe and develop a bipolar voltage representing measured line voltage. A voltage detection circuit comprises a differential amplifier circuit for converting the bipolar voltage to a proportionate voltage signal. A signal processing circuit receives the proportionate voltage signal and drives the display for displaying the measured line voltage.

It is a feature that the circuit comprises a low pass filter circuit.

It is another feature that the input circuit comprises ferrite beads to suppress high frequency noise.

It is a further feature that the input circuit comprises a bipolar protection circuit to protect the electrical circuit from high voltage transients.

It is a further feature that the processing circuit comprises an anti-aliasing filter connected to an analog to digital converter.

It is still another feature that the voltage detector circuit comprises a low power instrumentation amplifier with high common-mode rejection ratio.

It is still another feature that the electrical circuit comprises a zero crossing circuit between the voltage detection circuit and the processing circuit. The processing circuit compares time difference between zero crossings for different high voltage electrical lines for phase angle measurement.

It is still another feature that a transceiver circuit is operatively associated with the processing circuit for communicating with another high voltage detection device.

It is an additional feature that the electrical circuit comprises a battery powered circuit.

There is also disclosed a high voltage phasing meter including first and second high voltage probes each comprising an electrode connected in series with a resistor on a housing enclosing an electrical circuit for measuring line voltage of first and second high voltage lines, respectively. Each electrical circuit comprises an input circuit for connection to the probe. The input circuit is adapted to suppress high frequency noise pick up by the probe and develop a voltage representing measured line voltage. An amplifier circuit with high common-mode rejection ratio is connected to the input circuit. A signal processing circuit is connected to the amplifier circuit for detecting measured line voltage and detecting zero crossings of the measured line voltage. The first high voltage probe includes a communication circuit for transmitting the measured line voltage and detected zero crossings of the measured line voltage. The second high voltage probe includes a communication circuit for receiving the measured line voltage and detected zero crossings of the measured line voltage from the first high voltage probe. The second high voltage probe processing circuit determines phase relationships between the first and second high voltage lines and is connected to a display for displaying the phase relationships and measured line voltages.

It is a feature that each communication circuit comprises a wireless transceiver circuit, such as an RF module.

Other features and advantages will be apparent from a review of the entire specification, including the appended claims and drawings.

DETAILED DESCRIPTION

Figure 1:
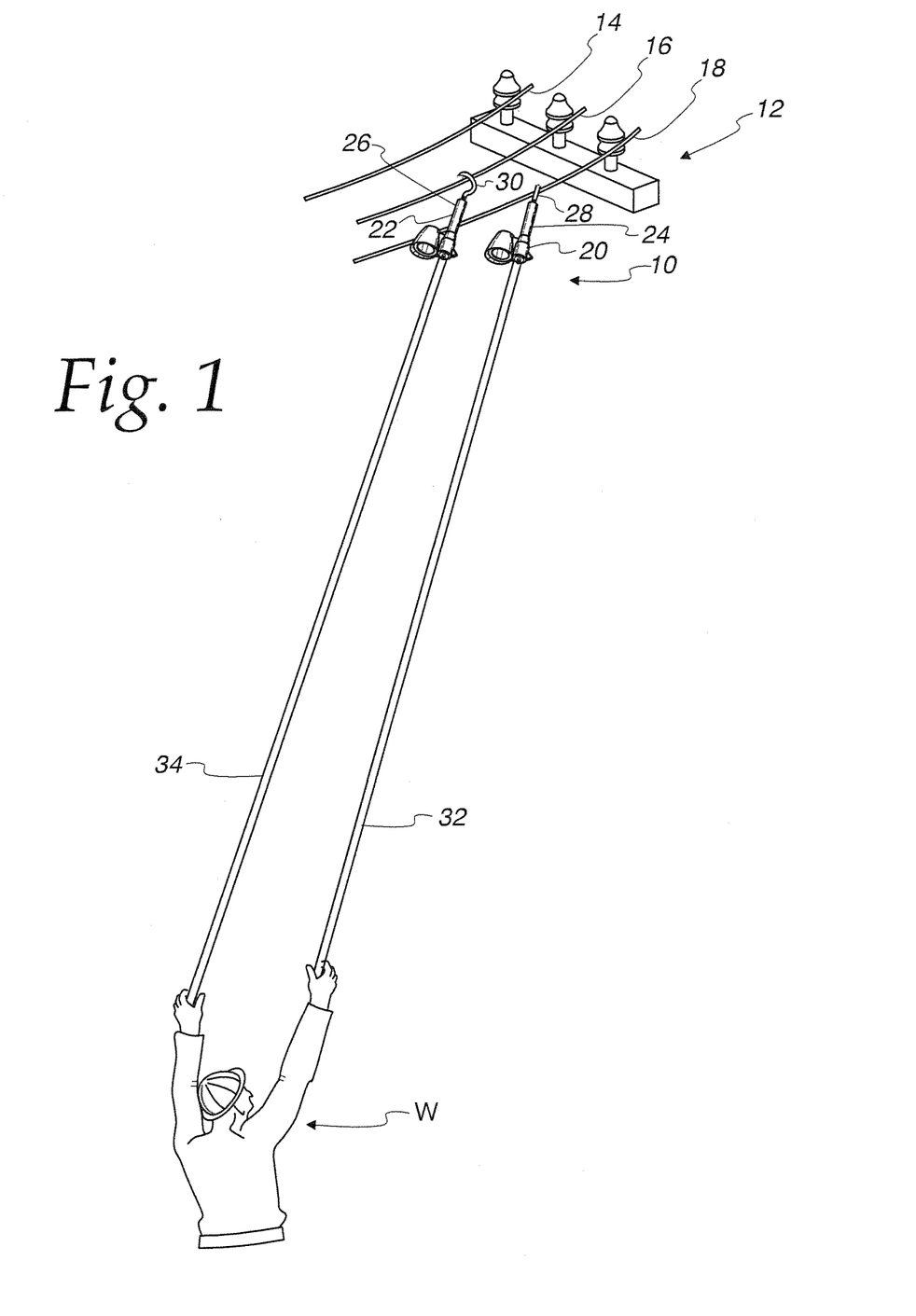
FIG. 1 is a perspective view of use of a high voltage phasing meter as described herein.

Referring initially to FIG. 1, a cordless high voltage phasing meter 10 is shown for measuring phase-to-phase voltage or voltage to ground between lines in a high voltage transmission line system 12. The transmission line system 12 includes three conductors 14, 16 and 18 carrying high voltage power of alternating current with each line being 120 degrees out of phase with the other lines, as is conventional. The phasing meter 10 may be used by a lineman or maintenance worker W for measuring voltage such as between the electrical conductors 16 and 18 as illustrated in FIG. 1. The phasing meter 10 may also be used to measure other voltages, such as phase to neutral, as is known.

Figure 2:
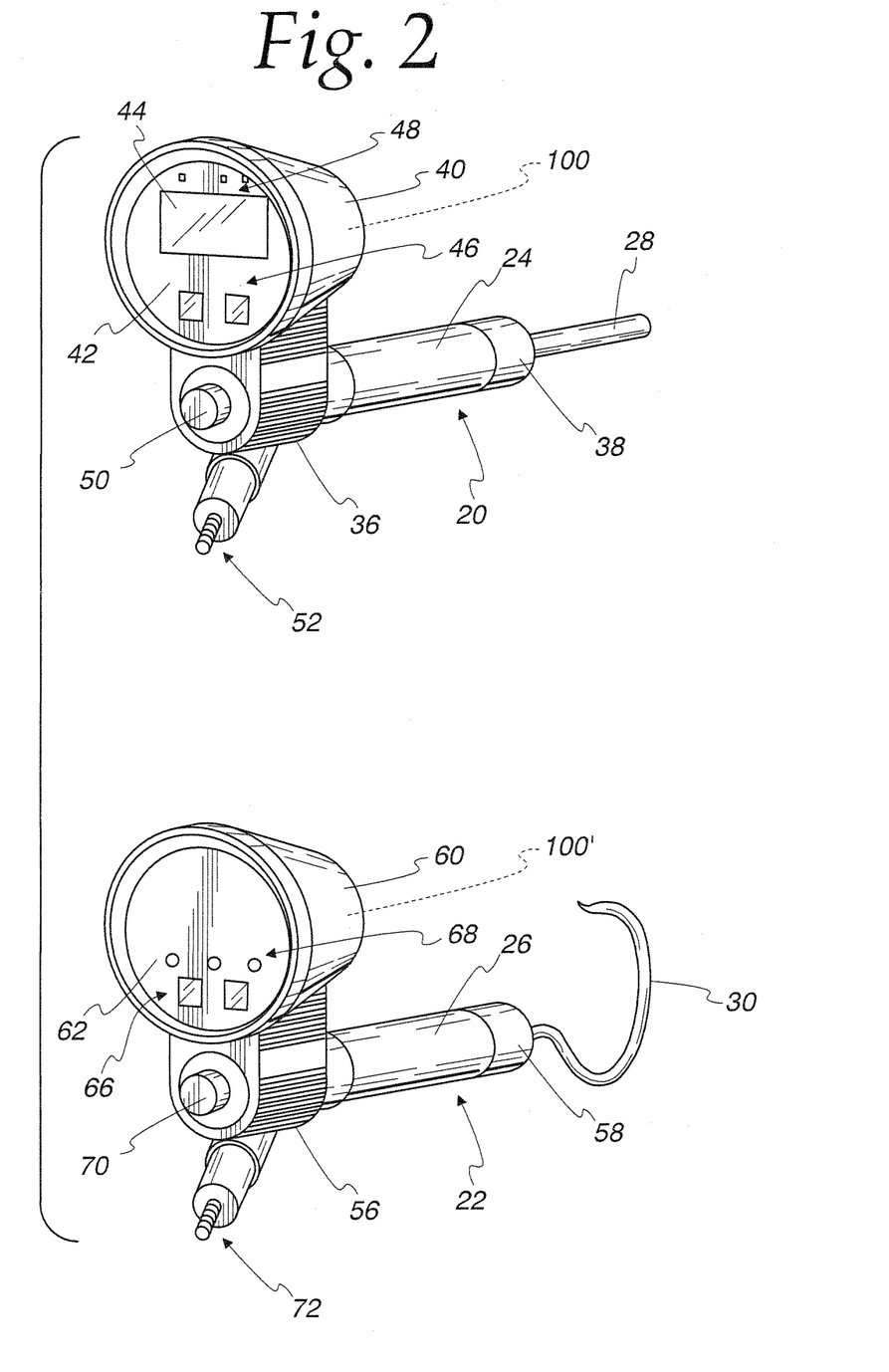
FIG. 2 a perspective view of the high voltage phasing meter comprising a meter probe and a reference probe as disclosed herein.

The phasing meter 10 comprises a first probe 20, also known as a meter probe, and a second probe 22, also known as a reference probe, see also FIG. 2. The first probe 20 includes an elongate insulated shield 24 and a first electrode 28 extending from a distal end thereof. The second probe 22 includes an elongate insulated shield 26 a second electrode 30 extending from a distal end thereof. A first extension pole 32, known as a hot stick, is connected to the first probe insulated shield 24. A second extension pole 34 is connected to the second probe insulated shield 26. The extension poles 32 and 34 are of a select length to enable the maintenance worker W to extend the probes 20 and 22 to the transmission line system 12 so that the electrodes 28 and 30 contact select ones of the transmission line conductors 14, 16 and 18.

Referring specifically to FIG. 2, the meter probe 20 comprises the elongate cylindrical insulated shield 24 connected to a handle portion 36 at a near end and a terminal 38 at a distal end. The terminal 38 threadably receives the electrode 28. The electrode 28 can be a straight probe as shown, or a hook, such as the electrode 30, or a clamp, or the like, as necessary or desired. A housing 40 is integrally formed with the handle portion 36. The housing 40 is frustoconical in shape including a face plate 42 including a display 44 and operator input buttons 46 and LED display elements 48. The display 44 can be an analog display or a digital display. An adaptor 50 on the handle portion 36 is aligned with the shield 24 and is adapted to secure the hot stick 32 in a conventional manner. An antenna 52 is used for cordless communication with the reference probe 22.

The reference probe 22 comprises the elongate cylindrical insulated shield 26 connected to a handle portion 56 at a near end and a terminal 58 at a distal end. The terminal 58 threadably receives the electrode 30. The electrode 30 can be a hook as shown, or a straight probe, such as the electrode 28, or a clamp, or the like, as necessary or desired. A housing 60 is integrally formed with the handle portion 56. The housing 60 is frustoconical in shape including a face plate 62 including operator input buttons 66 and LED display elements 68. An adaptor 70 on the handle portion 56 is aligned with the shield 26 and is adapted to secure the hot stick 34 in a conventional manner. An antenna 72 is used for cordless communication with the meter probe 20.

As shown in FIG. 1, the lineman W can grip the extension poles 32 and 34 to contact the lines 16 and 18 with the respective electrodes 28 and 30. The meter display 44 is visible to enable the lineman W to read the measured voltage across the terminals.

Figure 3:
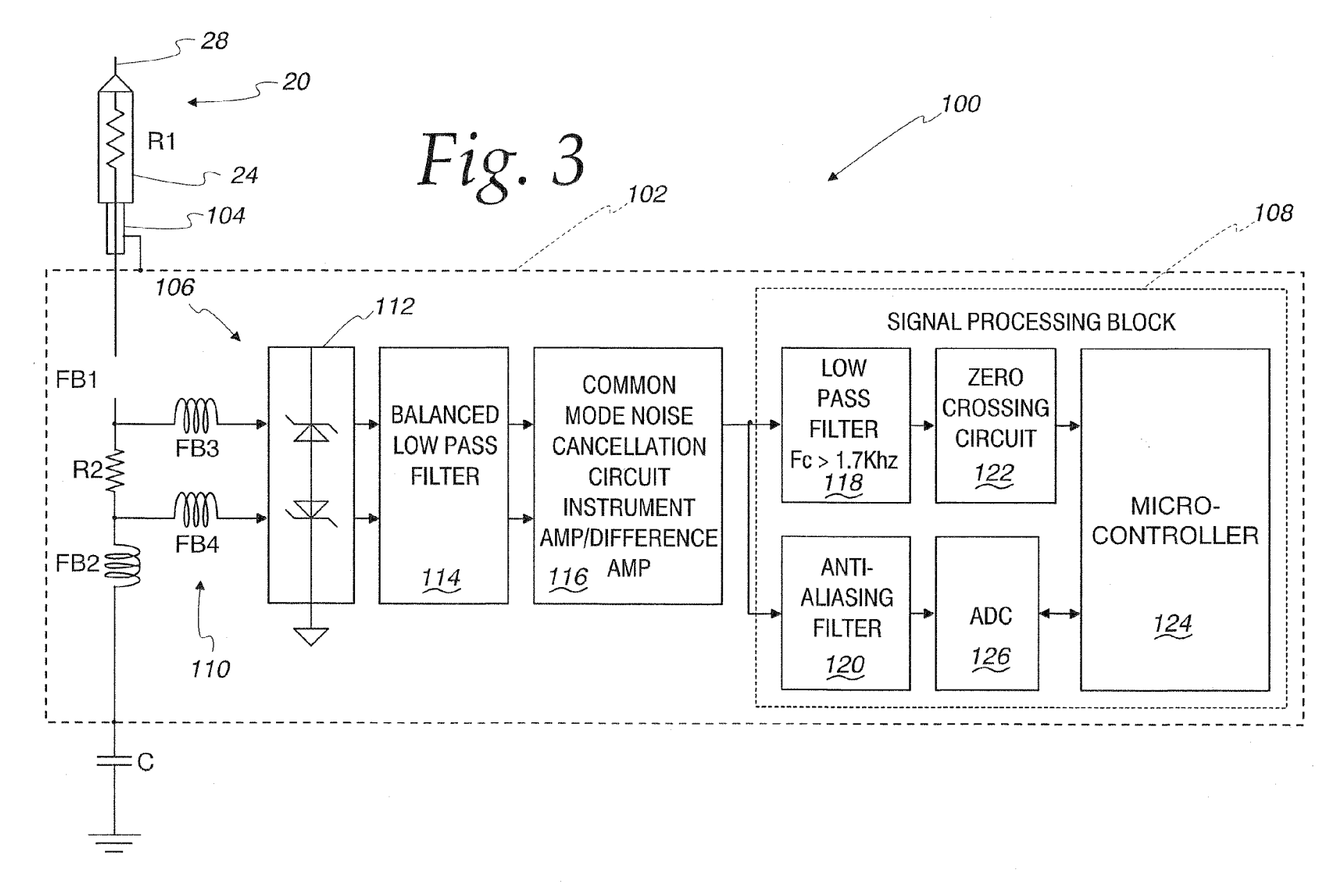
FIG. 3 is a block diagram of an electrical circuit for each of the probes of FIG. 2.

Referring to FIG. 3, the meter probe 20 comprises an electrical circuit 100 generally illustrated in block diagram form. The electrical circuit 100 is present on a circuit board 102 internal to the housing 40.

As described more particularly below, an electrical circuit 100', see FIG. 2, is utilized in the reference probe 22. The electrical circuits 100 and 100' are virtually identical except that the meter probe 20 performs calculations for phase angle measurement and includes the display 44 for displaying measured line voltage and phase relationships and the like. The electrical circuit 100 is described herein in connection with its operation as part of the meter probe 20, except where otherwise specifically mentioned. The electrical circuit 100' is not otherwise described herein as the circuit elements are generally the same.

In use, the meter probe 20 either makes contact with the high voltage electrical line using the electrode 28 for voltage detection and phase angle measurement, utilizing zero crossing pulse generation, or is brought in proximity to the high voltage electrical line for phase angle measurement only. The meter probe 20 includes a high voltage resistor R1. The high voltage resistor R1 is located in the shield 24 and is electrically connected in series with the electrode 28. The high voltage resistor R1 is connected to the printed circuit board 102 through a shielded cable 104. The printed circuit board 102 is placed inside the housing 40 which comprises a shielded conductive enclosure to short it to cable shield and battery ground, as illustrated.

The resistor R1 is connected in series with a resistor R2 and virtual capacitance C to earth ground to form a voltage divider between the sensed high voltage and earth ground. The proportionate voltage drop across the resistor R2, comprising a bipolar voltage, is connected to an analog front end circuit 106 and subsequently to a signal processing block 108. The analog front end circuit 106 includes an input circuit 110 including ferrite beads FB1, FB2, FB3 and FB4 used to suppress high frequency noise picked up by the probe electrode 28 and shield 24. The first ferrite bead FB1 is between the first and second resistors R1 and R2. The second ferrite bead FB2 is between the second resistor R2 and the virtual capacitance C. The third and fourth ferrite beads FB3 and FB4 are provided on conductors across the second resistor R2 to a bipolar protection circuit block 112. The protection circuit 112 comprises a TVS diode across the second resistor R2 to provide bipolar protection to the front end circuit 106 from high voltage transients by limiting the voltage to tolerable levels in the positive and negative side.

The output of the protection circuit 112 is provided to a balanced low pass filter circuit 114 used to filter out high frequency noise pick up by the electrode 28 and shield 24. The cut off frequencies of the filter 114 should be selected to provide minimum phase shift to the detected AC signal. For 50 Hz/60 Hz signals the cut off should be greater than 2 kHz. The output of the balanced low pass filter circuit 114 is provided to an instrument amplifier/difference amplifier circuit 116 with high common-mode rejection ratio and unity gain. This amplifier circuit 116 rejects common-mode noise/voltage picked up by the high voltage resistor R1 and shielded enclosure before signal processing. This common-mode voltage can affect the circuit at any frequency but predominantly occurs when the high voltage measurement is done in close proximity to a high 5 Hz/60 Hz field.

The detected proportion of voltage output from the amplifier circuit 116 is provided to the signal processing block 108 and particularly to both a low pass filter circuit 118 and an anti-aliasing filter 120. The low pass filter output is provided to a zero crossing circuit 122 which is a high speed comparator for zero crossing pulse generation provided to a microcontroller 124. The output of the anti-aliasing filter 120 is provided to an analog to digital converter 126 and thereafter to the microcontroller 124.

Figure 4A:
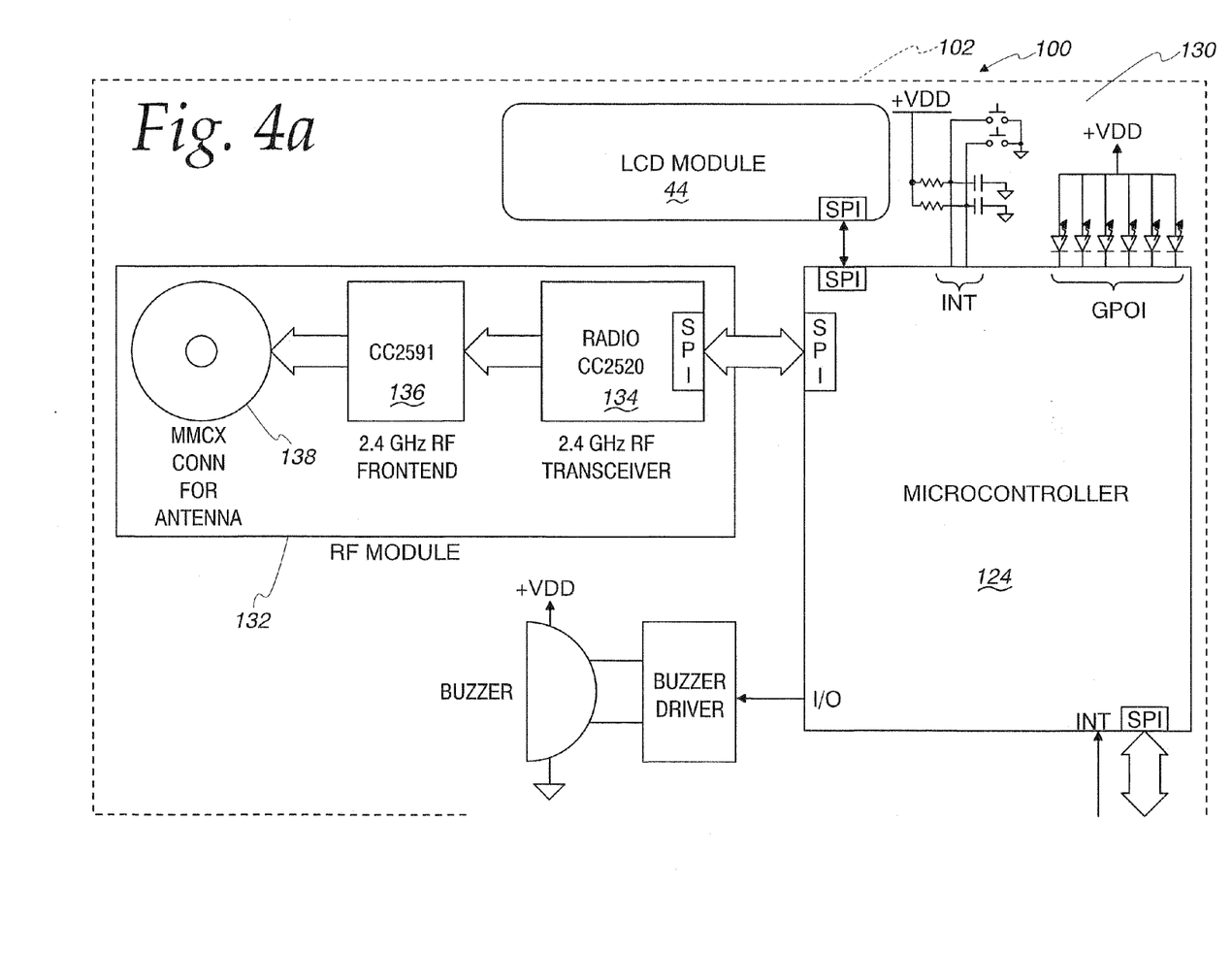
FIG. 4a and FIG. 4b are a generalized block diagram/electrical schematic for the circuit of FIG. 3 in greater detail.
Figure 4B:
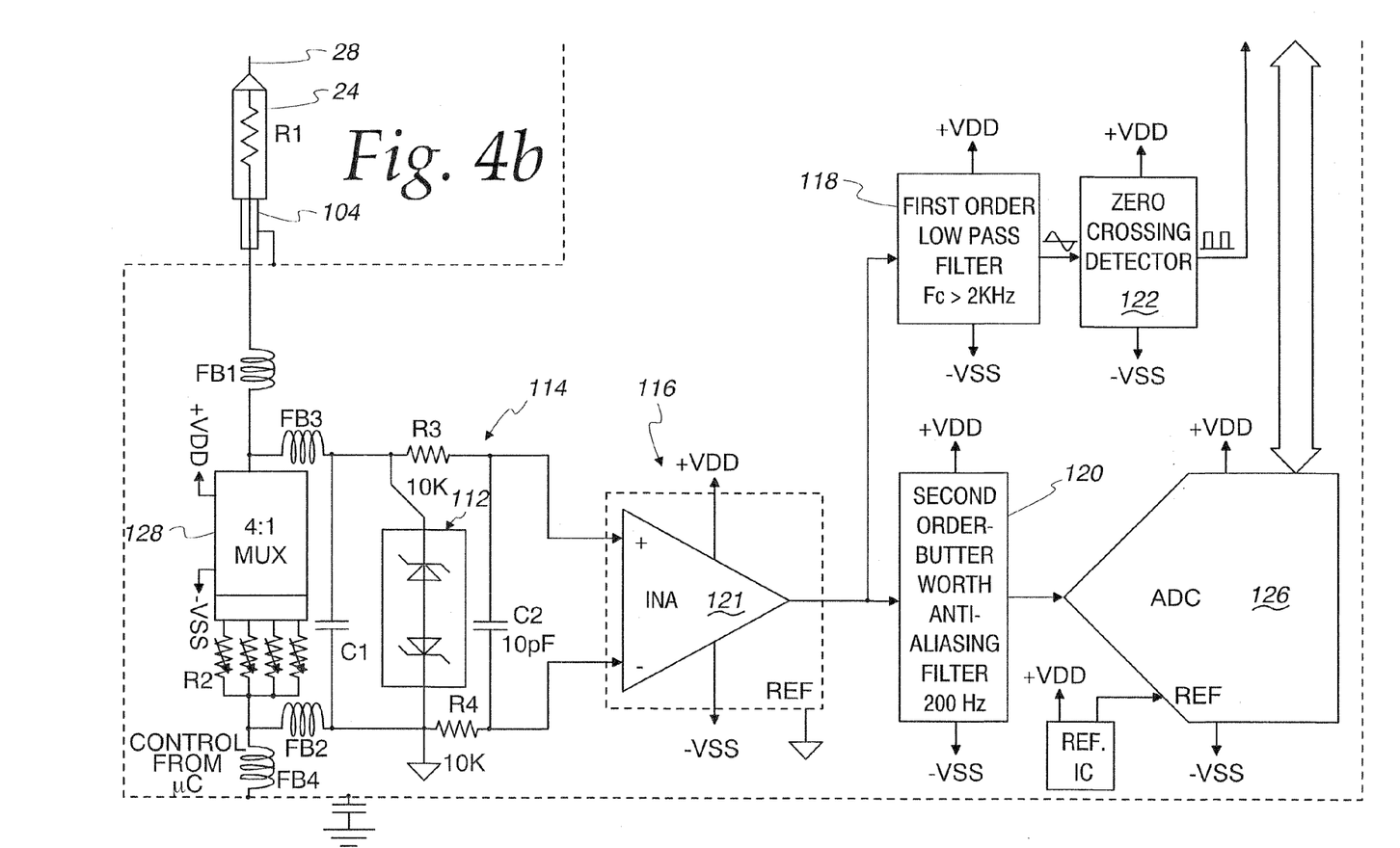

Referring to FIGS. 4a and 4b, the electrical circuit 100 is illustrated in greater detail.

The second resistor R2 is formed by an array of variable resistors connected to a multiplexer 126 to provide the bipolar voltage. A capacitor C1 across the resistor R2 and forms a parallel RC filter. The low pass filter 114 is formed by a capacitor C2 and resistors R3 and R4 which form a balanced series RC filter network to filter out high frequency noise. The amplifier circuit 116 may comprise, for example, an INA121 low power instrumentation amplifier which provides high common-mode rejection and converts the bipolar voltage to a proportionate voltage signal.

The microcontroller 124 is connected to the LCD module which comprises the display 44 and to a switch and LCD interface circuit 130 operatively associated with the buttons 46 and indicators 48, see FIG. 2. An RF module 132 is operatively connected to the microcontroller 124 for communication with the reference probe 22. The RF module comprises a transceiver circuit 134, an RF front end circuit 136 and an antenna connector 138 for connection to the antenna 52. The microcontroller 124 operates in accordance with a control program for performing voltage and phase measurements in a known manner. As disclosed herein, the measurements are made using virtually noise free signals.

Figures 5, 5C:
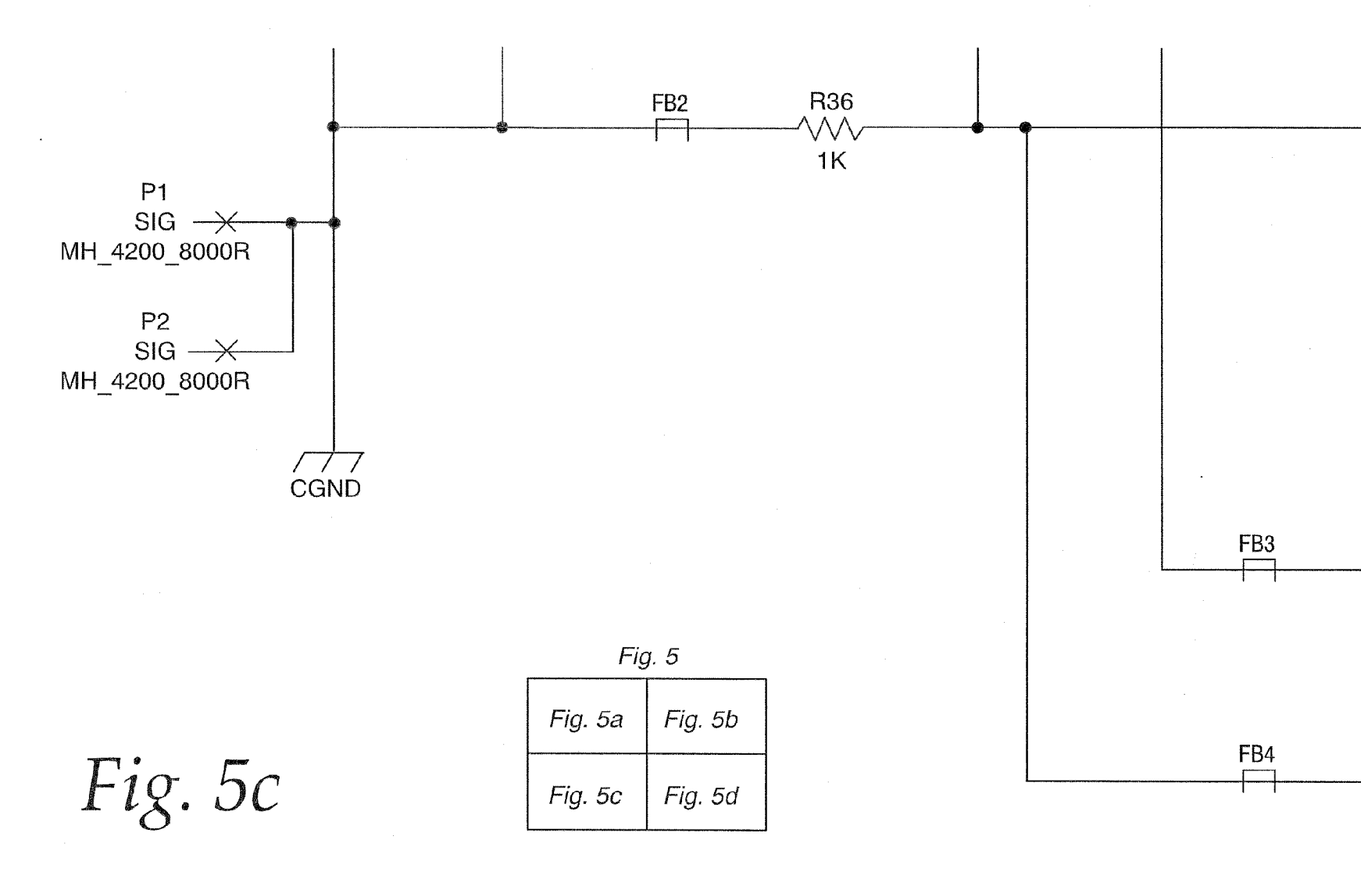
FIG. 5a, FIG. 5b, FIG. 5c, FIG. 5d are an electrical schematic of a voltage detection circuit for each of the probes.
Figure 5A:
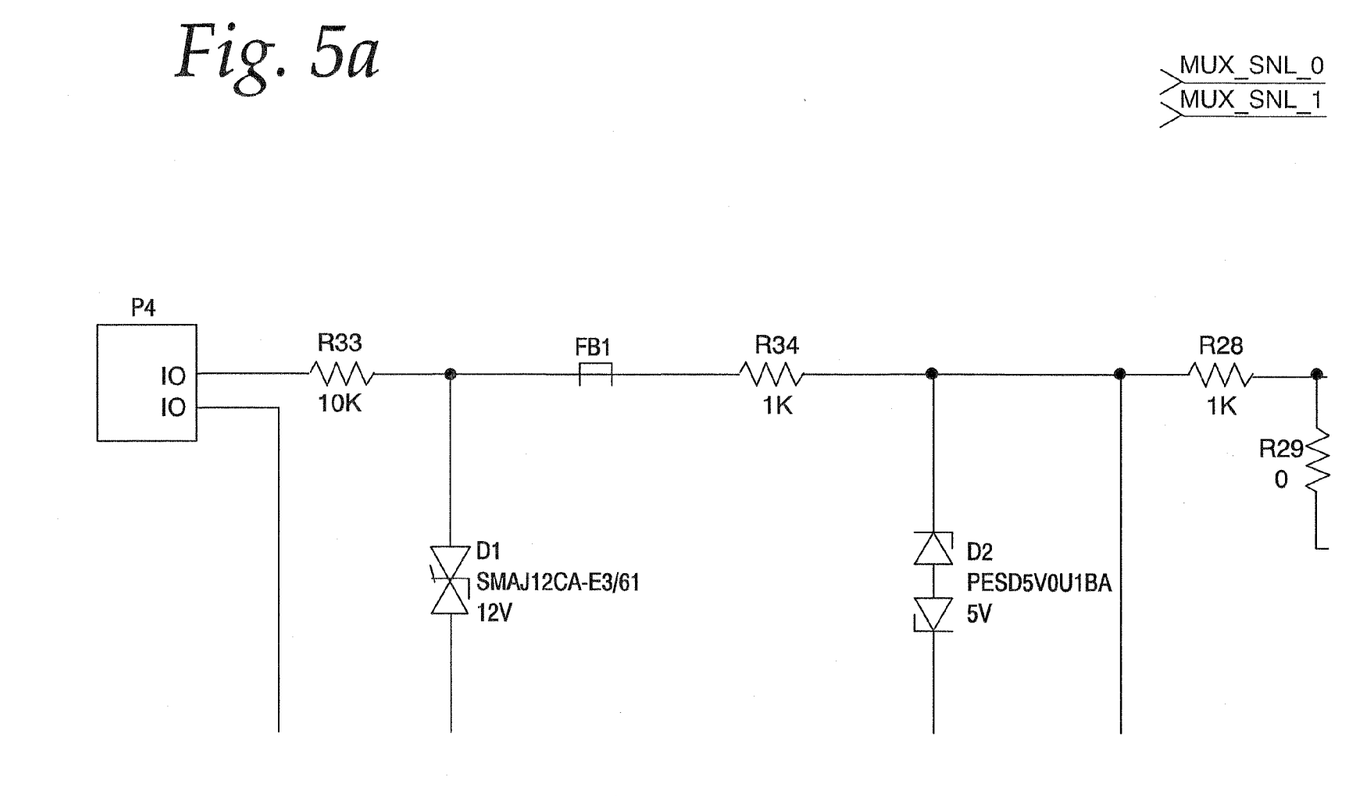
Figure 5B:
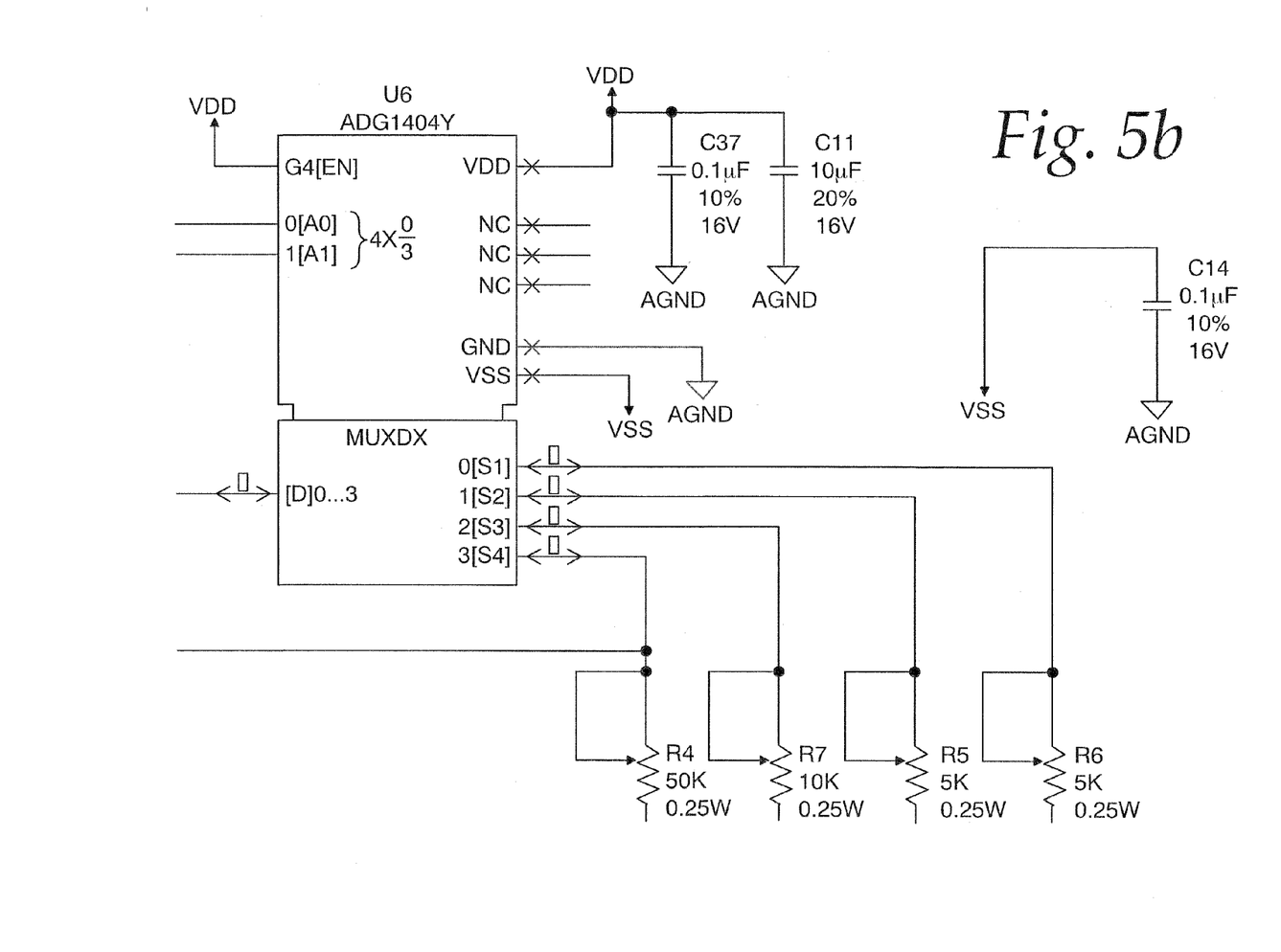

Referring to FIG. 5, an electrical schematic is shown for the analog front end circuit 106. The probe high resistor R1 is terminated at a connector P4 via shielded cable. The high voltage probe resistor R1, see FIG. 3, resistor R33, ferrite bead FB1, resistor R34 and R28 are connected to one of the variable resistors R4, R5, R6 or R7, a resistor R36 and the ferrite bead FB2 by the multiplexer or switch U2 to form a voltage divider network. The drop across the variable resistor is determined by the variable resistor value. The different resistance values R4-R7 are used in different modes of operation, such as URD, OH, etc., and the switching of the resistors is controlled by selecting the control pins of the multiplexer or switch U6 which could be a type ADG1404Y device.

The selected one of the variable resistors R4, R5, R6 or R7 and a capacitor C9 form a parallel RC network that provides high frequency filtering. Resistors R27, R25 and capacitor C9 form another balanced RC network for high frequency filtering.

A diode D1, or a zener diode (or two TVS or zener diodes connected in the same configuration), comprises an ultra low leakage bipolar transient voltage suppressor that will restrict voltage drop across the resistor R28 in series with the variable resistor R4 or R7 or R5 or R6. This directs voltage input across the instrument amplifier U3 inputs VIN+VIN− to a safe value. It also protects the analog front end circuit 106 from any transients, overload conditions, etc.

The detected voltage across the resistor R28 and the selected variable resistor R4-R7, is fed to the operational amplifier U3 inputs configured in unity mode. The output of the amplifier U3 comprises an INA output and is fed to the zero crossing detector and anti-aliasing circuits, discussed above, for further processing.

Figures 6, 6A:
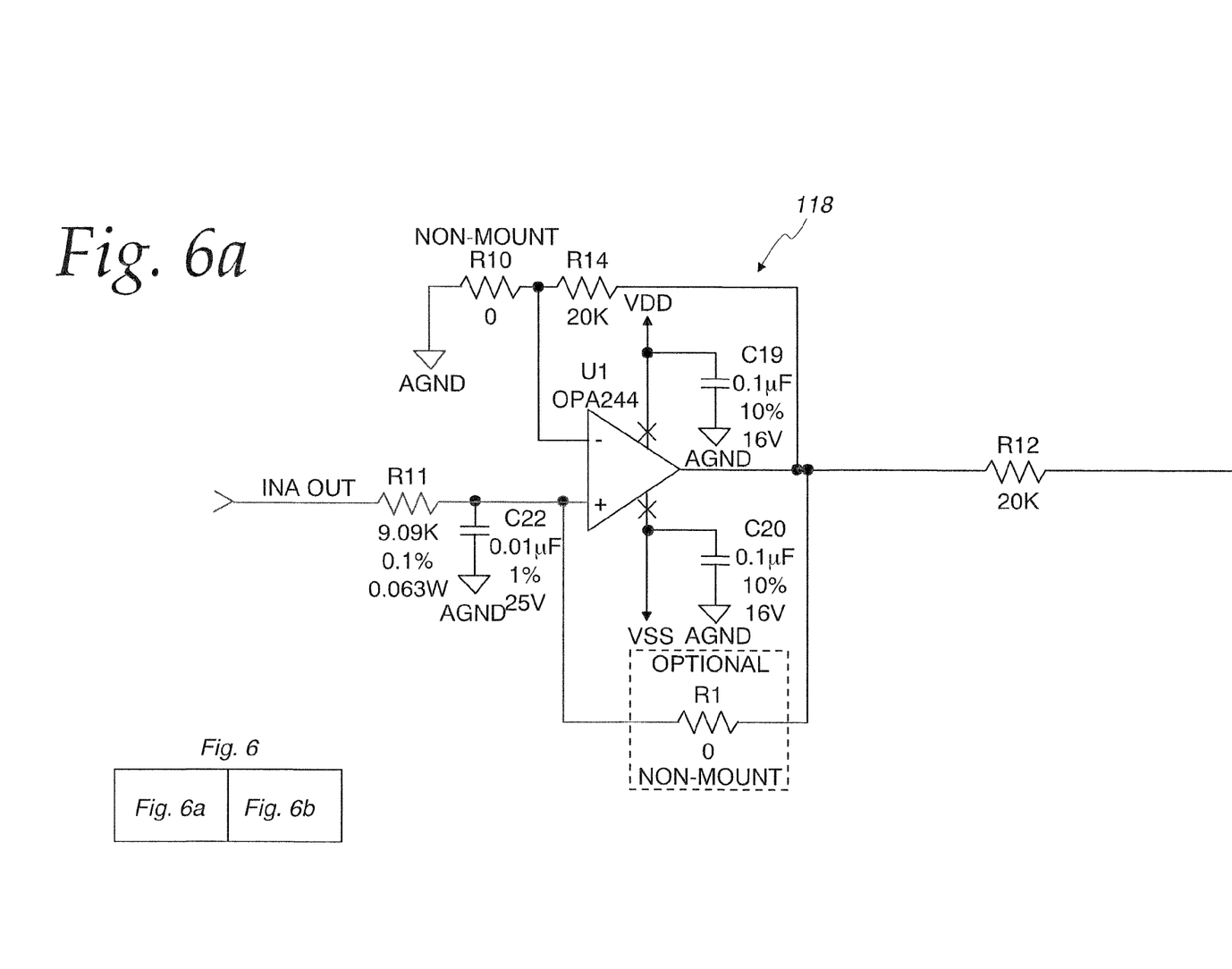
FIG. 6a and FIG. 6b are an electrical schematic of a low pass filter and zero crossing detector circuits for each of the probes.
Figure 6B:
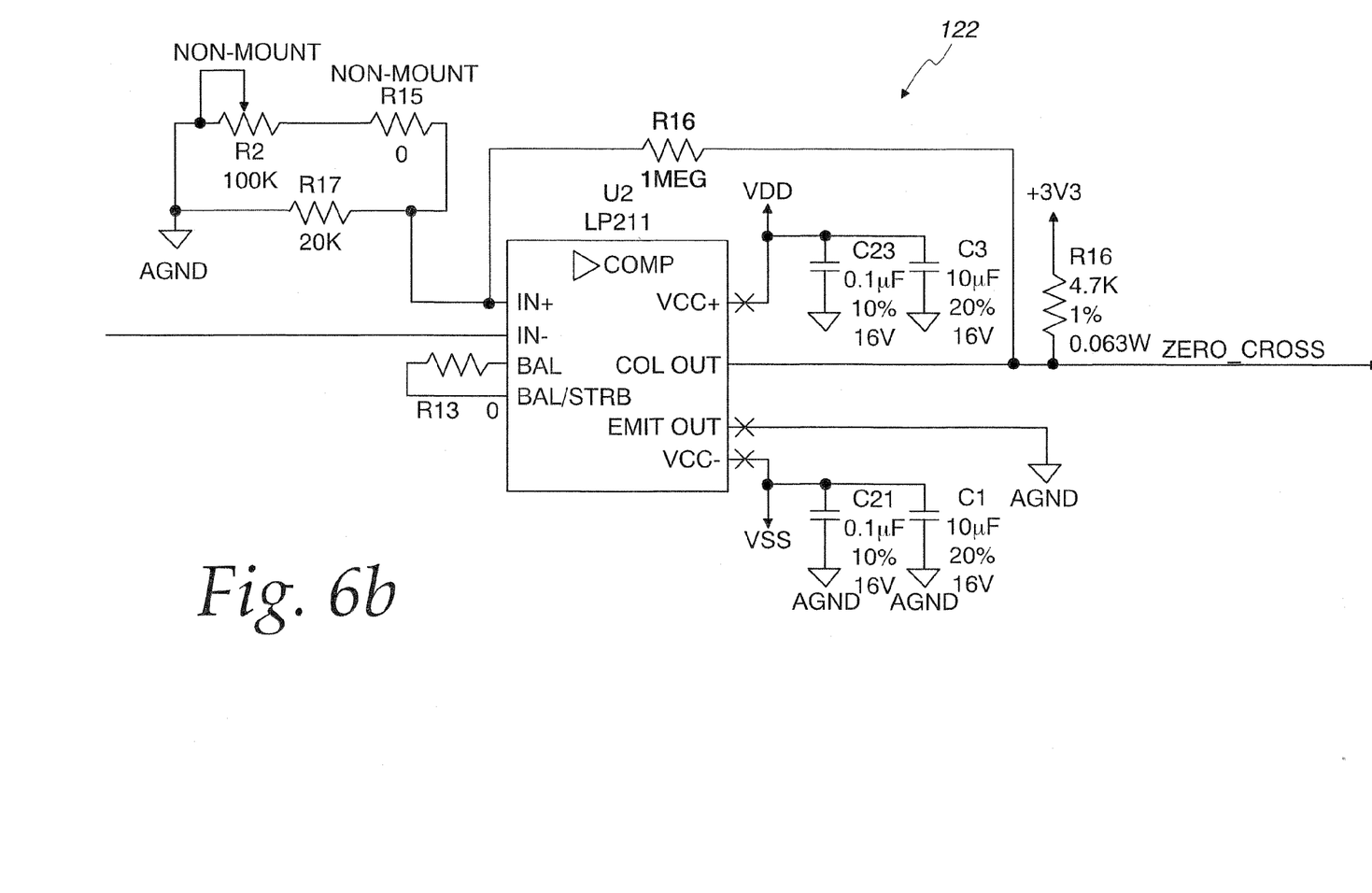

Referring to FIG. 6, the low pass filter circuit 118 is illustrated in FIG. 6a and the zero crossing detector circuit 122 is illustrated in FIG. 6b. Particularly, the INA output is passed through an active low pass filter circuit 118 using an operational amplifier U1, such as an op-amp OPA244. The cut off frequency is determined by a resistor R11 and capacitor C22 which is 1.75 KHz in the illustrated embodiment. The output is provided to a comparator U2 of the zero crossing detector 122 such as an LP211 circuit configured in inverting mode with hysteresis. Resistors R22 and R19 set the hysteresis voltage of the comparator. The output comprises a series of pulses corresponding to the zero crossings.

Figure 5D:
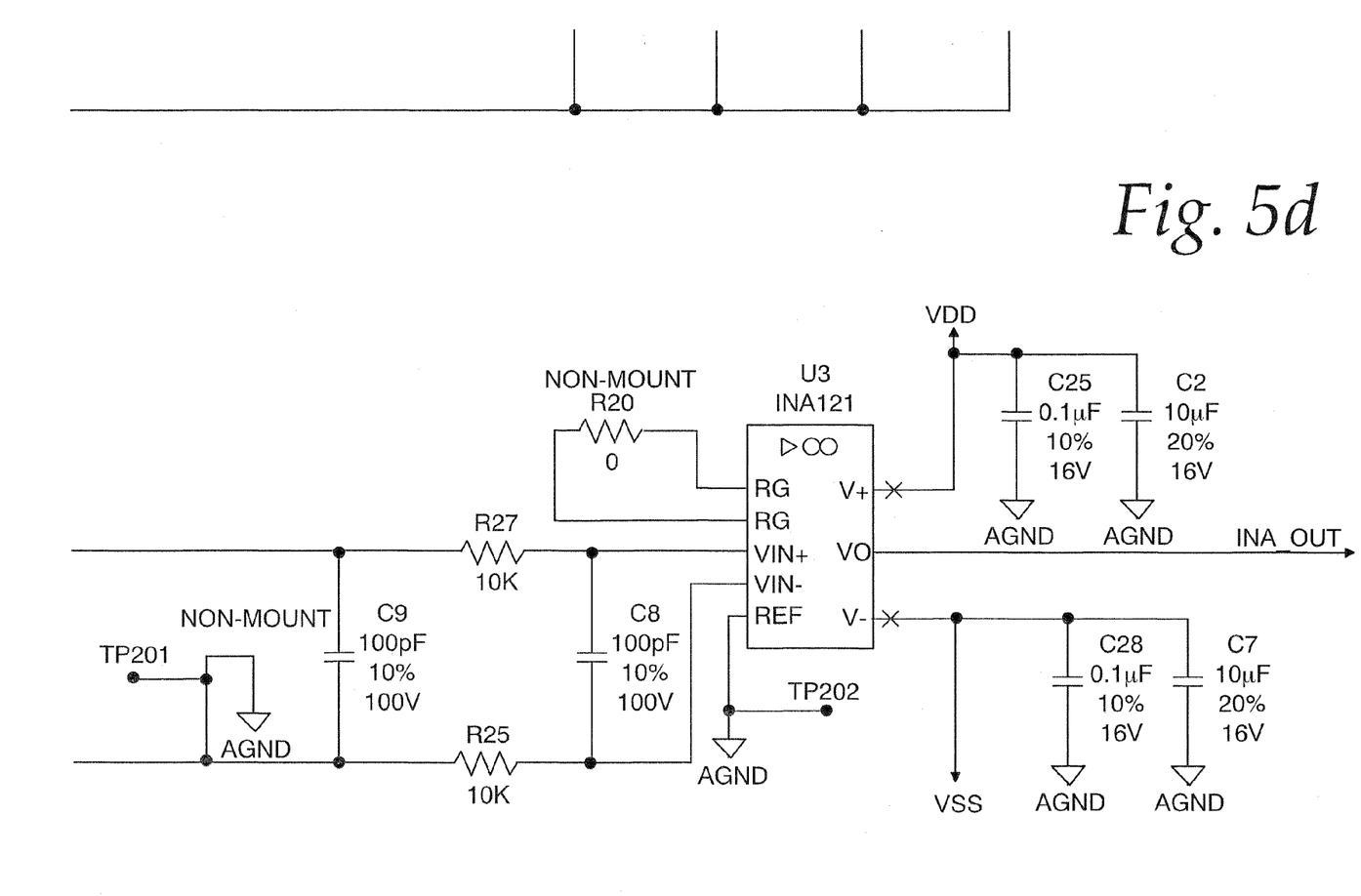
Figures 7, 7A:
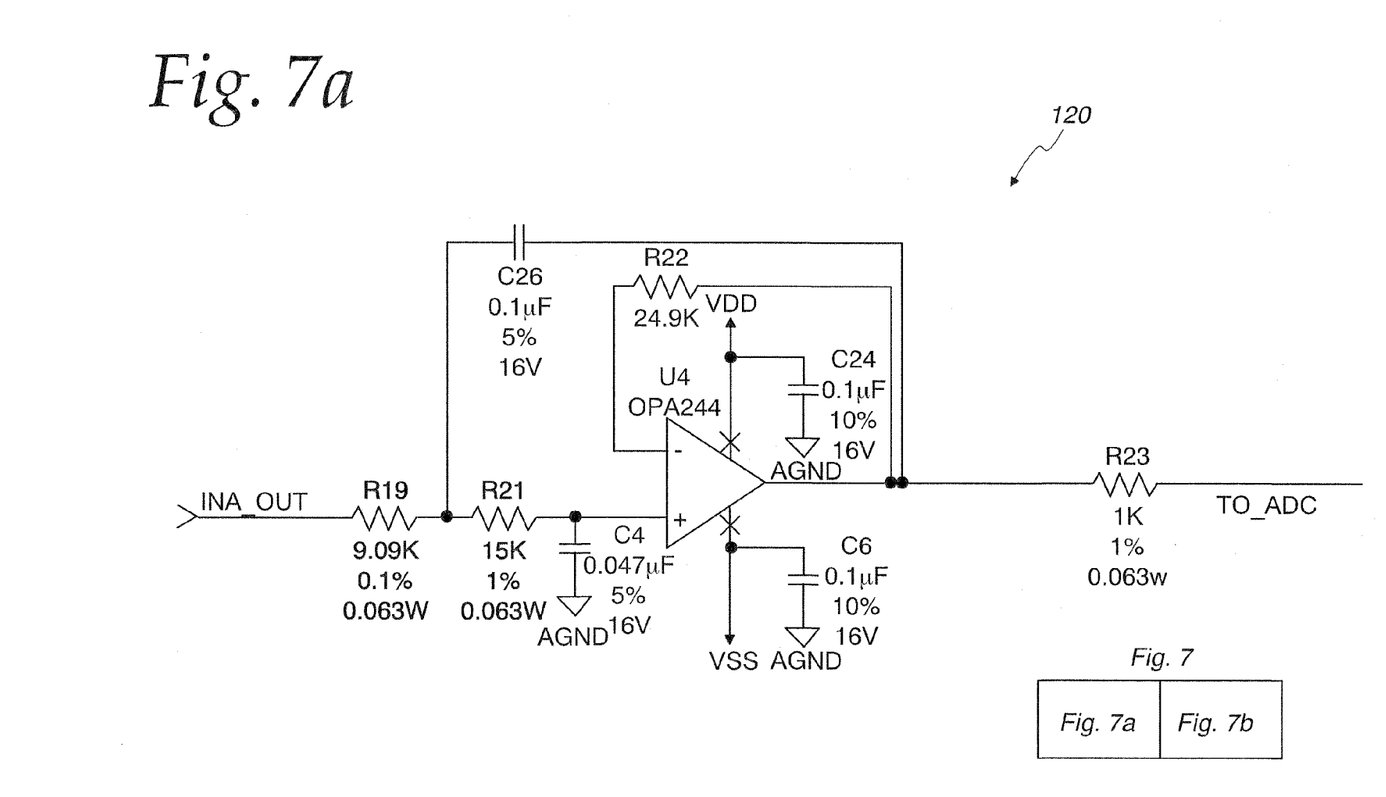
FIG. 7a is an electrical schematic of an anti-aliasing filter circuit and FIG. 7b is an electrical schematic for an analog to digital converter circuit.

Referring to FIG. 7a, the anti-aliasing filter circuit 120 is illustrated. Particularly, the detected proportionate voltage from the output of the instrument amplifier U3, see FIG. 5d, is passed through the anti-aliasing filter circuit 120 before analog to digital conversion. Aliasing occurs when an input signal has frequency components at or higher than half the sampling frequency or rate. If the signal is not correctly filtered or band limited to eliminate these frequencies, then they will show up as aliases or spurious lower frequency components that cannot be detected from valid sample data. These errors in data are actually at a higher frequency, but when sampled, would appear as a lower frequency, and thus, false information. The circuit 120 uses an op-amp U4, such as an OPA244. The cutoff frequency is determined by resistors R21 and R22 and capacitors C26 and C14. In the illustrated embodiments, the cut off frequency is 200 Hz.

Figure 7B:
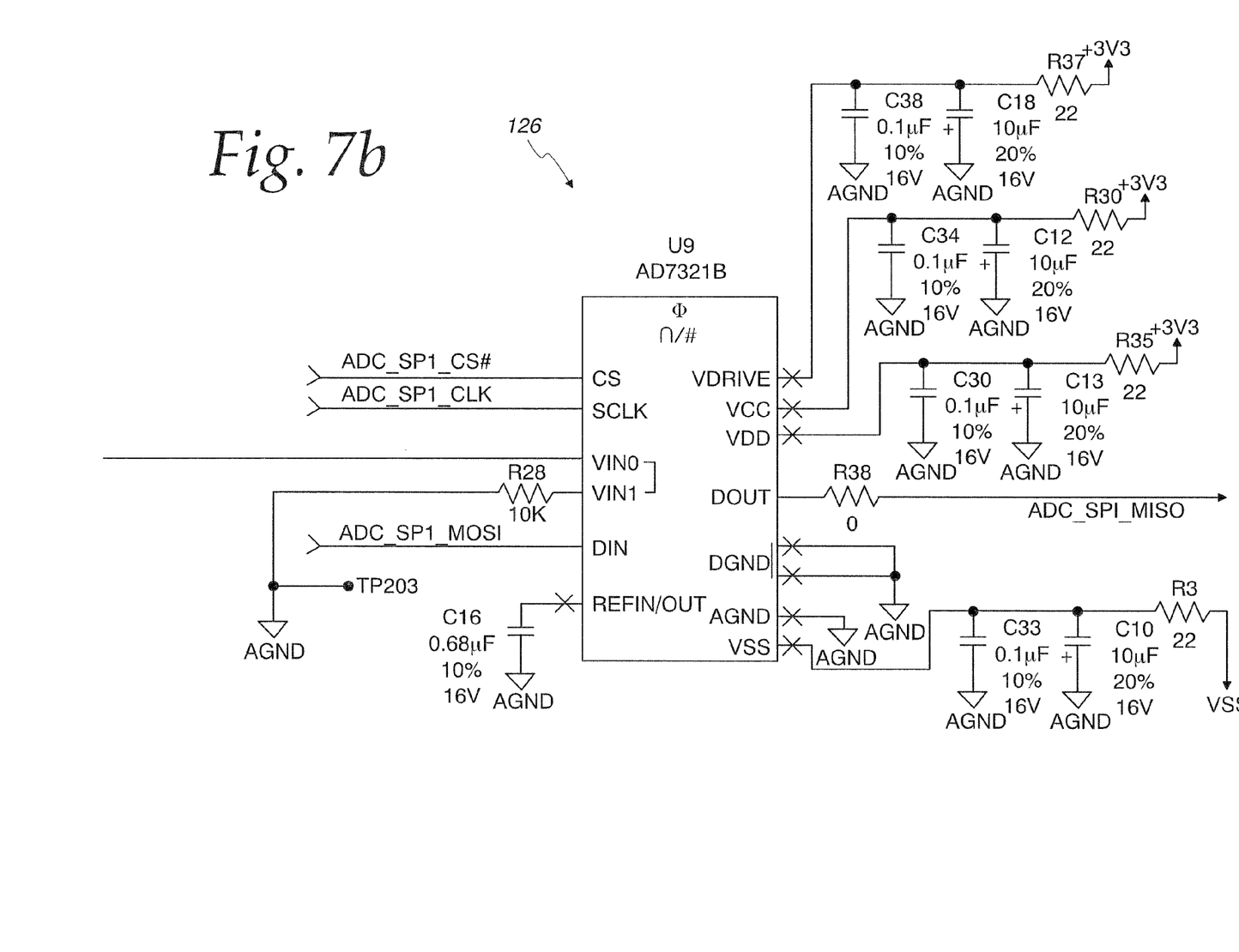

FIG. 7b illustrates an electrical schematic for the analog to digital converter circuit 126 and uses a 12 bit AD7321 circuit U9 for analog to digital conversion. The circuit U9 can accept bipolar input voltages and have built in reference source. The sample data is sent to the microcontroller 124 via a serial interface. An alternative approach is to use an external ADC that can accept uni-polar and use bipolar voltages to uni-polar voltage conversion that can provide voltage within the ADC input range. External voltage reference or internal reference source can also be used.

As described above, the microcontroller 124 in the meter probe 20 is adapted to detect measured line voltage and detect zero crossings of the measured line voltage. Likewise, the reference probe 22 includes a similar electrical circuit 100' with a microcontroller that likewise detects the measured line voltage and detect zero crossings of the measured line voltage such as for the line 16. The RF module 132 in the reference probe 22 is used to transmit the measured line voltage and detected zero crossings to the meter probe 20 via the corresponding RF module 132 of the meter probe 20 to be provided to its microcontroller 124. The microcontroller 124 of the meter probe 20 is programmed to displaying line voltage on the LCD module 44 and for calculating phase relationships also for display on the LCD module 44.

Figure 8:
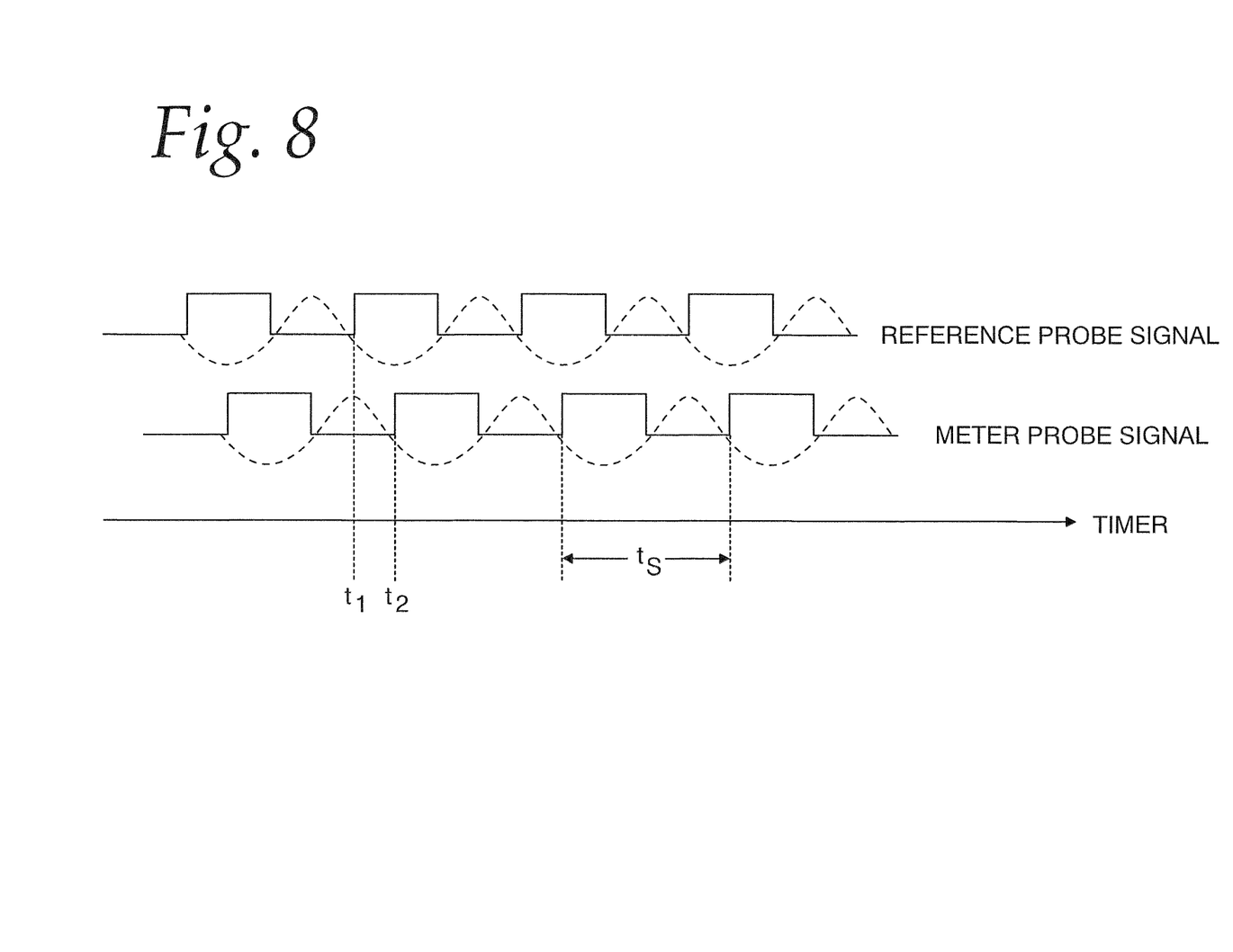
FIG. 8 is a timing diagram illustrating phase angle measurements implemented in the phasing meter disclosed herein.

Phase angle measurement between two phases is measured by calculating the time difference between zero crossing pulses of the meter probe 20 and reference probe 22. The time difference is converted into an angle and shown on the display 44. FIG. 8 illustrates the phase relationships between the reference probe signal and the meter probe signal. The time $t_1$ is a time stamp of the rising edge of the zero crossing pulses received from the reference probe with a reference time being the internal timer of the meter probe. The time $t_2$ is a time stamp of the rising edge of the zero crossing pulses captured by the meter probe 20 with the reference time being the same internal timer in the meter probe. The phase angle is equal to $(t2-t1)*360/t_s$ where $t_s$ is the time between successive rising edges of the zero crossing pulses. For accurate phase angle measurement, the zero crossing pulses should not be affected by the high frequency or low frequency noise and have fast rise times. The detected proportion of voltage from the output of the instrument amplifier U3 is passed through the low pass filter circuit 118 and in the zero crossing circuit 122. The filter's cut off frequency and tolerance of components are selected such that they will introduce minimum and known phase shifts for detected signals of 50 Hz/60 Hz frequency. This phase shift is compensated for during phase calculations.

The phasing meter 10 uses probes 20 and 22 including instrumentation amplifiers which provide common-mode rejection of front end noise when the meter is used in close proximity to 50 Hz/60 Hz fields. The analog input stage is protected from transients. The enclosure is fully shielded and rejection of undesirable signals is provided at the input. The voltage detection techniques can be used in various products that require noise free voltage detection. Improved accuracy is provided by using high speed comparators to achieve higher phase accuracy and filters to reject high frequency and unwanted low frequency noise. The probes also use low power solutions which extend battery device and all systems such as the microcontroller wireless module analog to digital converter, etc., are selected to support low power battery operation.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. Other embodiments may be within the scope of the following claims.

The invention claimed is:

1. A high voltage detection device comprising:
a probe comprising an electrode for contacting a high voltage electrical line, the electrode being connected in series with a resistor; and
a meter comprising a housing enclosing an electrical circuit for measuring line voltage, the electrical circuit comprising an input circuit for connection to the probe, the input circuit being adapted to suppress high frequency noise pick up by the probe and developing a bipolar voltage representing measured line voltage, a voltage detection circuit comprising a differential amplifier circuit for converting the bipolar voltage to a proportionate voltage signal, a signal processing circuit receiving the proportionate voltage signal and driving a display for displaying the measured line voltage.

2. The high voltage detection device of claim 1 wherein the input circuit comprises a low pass filter circuit.

3. The high voltage detection device of claim 1 wherein the input circuit comprises ferrite beads to suppress high frequency noise.

4. The high voltage detection device of claim 1 wherein the input circuit comprises a bipolar protection circuit to protect the electrical circuit form high voltage transients.

5. The high voltage detection device of claim 1 wherein the processing circuit comprises an anti aliasing filter connected to an analog to digital converter.

6. The high voltage detection device of claim 1 wherein the voltage detector circuit comprises a low power instrumentation amplifier with high common-mode rejection ratio.

7. The high voltage detection device of claim 1 wherein the electrical circuit further comprises a zero crossing circuit between the voltage detection circuit and the processing circuit.

8. The high voltage detection device of claim 7 wherein the processing circuit compares time difference between zero crossings for different high voltage electrical lines for phase angle measurement.

9. The high voltage detection device of claim 1 further comprising a transceiver circuit operatively associated with the processing circuit for communicating with another high voltage detection device.

10. The high voltage detection device of claim 1 wherein the electrical circuit comprises a battery powered circuit.

11. A high voltage phasing voltmeter comprising:
a first high voltage probe comprising an electrode connected in series with a resistor, and a housing enclosing an electrical circuit for measuring line voltage of a first high voltage line, the electrical circuit comprising an input circuit for connection to the probe, the input circuit being adapted to suppress high frequency noise pick up by the probe and developing a voltage representing measured line voltage, an amplifier circuit with high common-mode rejection ratio connected to the input circuit, a signal processing circuit connected to the amplifier circuit for detecting measured line voltage and detecting zero crossings of the measured line voltage, and a communication circuit for transmitting the measured line voltage and detected zero crossings of the measured line voltage;
a second high voltage probe comprising an electrode connected in series with a resistor, and a housing enclosing an electrical circuit for measuring line voltage of a second high voltage line, the electrical circuit comprising an input circuit for connection to the probe, the input circuit being adapted to suppress high frequency noise pick up by the probe and developing a voltage representing measured line voltage, an amplifier circuit with high common-mode rejection ratio connected to the input circuit, a signal processing circuit connected to the amplifier circuit for detecting measured line voltage and detecting zero crossings of the measured line voltage, and a communication circuit for receiving the measured line voltage and detected zero crossings of the measured line voltage from the first high voltage probe, the processing circuit determining phase relationships between the first and second high voltage lines and being connected to a display for displaying the phase relationships and measured line voltages.

12. The high voltage phasing voltmeter of claim 11 wherein each input circuit comprises a low pass filter circuit.

13. The high voltage phasing voltmeter of claim 11 wherein each input circuit comprises ferrite beads to suppress high frequency noise.

14. The high voltage phasing voltmeter of claim 11 wherein each input circuit comprises a bipolar protection circuit to protect the electrical circuit form high voltage transients.

15. The high voltage phasing voltmeter of claim 11 wherein each processing circuit comprises an anti aliasing filter connected to an analog to digital converter.

16. The high voltage phasing voltmeter of claim 11 wherein each voltage detector circuit comprises a low power instrumentation amplifier with high common-mode rejection ratio.

17. The high voltage phasing voltmeter of claim 11 wherein the second probe processing circuit compares time difference between zero crossings for the first and second high voltage electrical lines for phase angle measurement.

18. The high voltage phasing voltmeter of claim 11 wherein each electrical circuit comprises a battery powered circuit.

19. The high voltage phasing voltmeter of claim 11 wherein each communication circuit comprises a wireless transceiver circuit.

20. The high voltage phasing voltmeter of claim 11 wherein each communication circuit comprises an RF module.

\* \* \* \* \*